(12) United States Patent
Cao et al.

(10) Patent No.: US 9,799,294 B2
(45) Date of Patent: Oct. 24, 2017

(54) LIQUID CRYSTAL DISPLAY DEVICE AND GOA SCANNING CIRCUIT OF THE SAME

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Shangcao Cao, Guangdong (CN); Juncheng Xiao, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 114 days.

(21) Appl. No.: 14/787,033

(22) PCT Filed: Sep. 11, 2015

(86) PCT No.: PCT/CN2015/089432
§ 371 (c)(1),
(2) Date: Oct. 26, 2015

(87) PCT Pub. No.: WO2017/028350
PCT Pub. Date: Feb. 23, 2017

(65) Prior Publication Data
US 2017/0162154 A1 Jun. 8, 2017

(51) Int. Cl.
*G09G 3/36* (2006.01)

(52) U.S. Cl.
CPC ......... *G09G 3/3677* (2013.01); *G09G 3/3696* (2013.01); *G09G 2300/0408* (2013.01);
(Continued)

(58) Field of Classification Search
CPC .. G09G 3/3648; G09G 3/3674; G09G 3/3696; G09G 2300/0426;
(Continued)

(56) References Cited

U.S. PATENT DOCUMENTS

| | | | | |
|---|---|---|---|---|
| 2008/0012816 A1* | 1/2008 | Moon | ................. | G11C 19/184 345/100 |
| 2010/0182227 A1* | 7/2010 | Tsou | ..................... | G09G 3/3677 345/100 |

(Continued)

FOREIGN PATENT DOCUMENTS

| | | |
|---|---|---|
| CN | 104537991 A | 4/2015 |
| CN | 104575436 A | 4/2015 |

*Primary Examiner* — Md Saiful A Siddiqui
(74) *Attorney, Agent, or Firm* — Andrew C. Cheng

(57) ABSTRACT

The present invention discloses a liquid crystal display device and a GOA scanning circuit. The GOA scanning circuit includes multiple cascaded GOA circuit units, and an n-th stage GOA circuit unit includes: a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal STn−1 of a previous stage GOA circuit unit; a control terminal of the second thin-film transistor is connected with a stage-transferring signal STn+1 of a next stage GOA circuit unit.

12 Claims, 3 Drawing Sheets

(52) U.S. Cl.
CPC ............... *G09G 2300/0842* (2013.01); *G09G 2310/0213* (2013.01); *G09G 2310/0289* (2013.01); *G09G 2310/08* (2013.01)

(58) Field of Classification Search
CPC ..... G09G 2330/021; G09G 2310/0286; G09G 2310/08; G09G 3/3677; G09G 2300/0408; G09G 2310/0289; G09G 2310/0213; G09G 2300/0842; G09G 3/36
See application file for complete search history.

(56) References Cited

U.S. PATENT DOCUMENTS

| | | | |
|---|---|---|---|
| 2010/0277206 A1* | 11/2010 | Lee | G09G 3/3677 327/108 |
| 2014/0044228 A1* | 2/2014 | Jang | G11C 19/00 377/64 |
| 2014/0062979 A1 | 3/2014 | Liu et al. | |
| 2014/0253424 A1 | 9/2014 | Yu et al. | |
| 2015/0263722 A1* | 9/2015 | Kim | H03K 17/162 315/161 |
| 2016/0372070 A1 | 12/2016 | Hu et al. | |

* cited by examiner

LIQUID CRYSTAL DISPLAY DEVICE AND GOA SCANNING CIRCUIT OF THE SAME

CROSS REFERENCE

This application claims the priority of international application number: PCT/CN2015/089432, entitled "LIQUID CRYSTAL DISPLAY DEVICE AND GOA SCANNING CIRCUIT OF THE SAME", filed on Sep. 11, 2015, the disclosure of which is incorporated herein by reference in its entirety.

BACKGROUND OF THE INVENTION

1. Field of the Invention

The present invention relates to a display technology field, and more particularly to a liquid crystal display device and a GOA scanning circuit of the same.

2. Description of Related Art

A liquid crystal display device has many advantages such as thin size, saving power, and no radiation so that the liquid crystal display device has been widely applied. For example: the liquid crystal TV, the cell phone, the personal digital assistant (PDA), the digital camera, the computer screen, or the notebook screen. Accordingly, in the flat display field, the liquid crystal display device has a dominant position.

In the current market, the liquid crystal display is mainly a backlight type liquid crystal display including a liquid crystal display panel and a backlight module. An operation principle of the liquid crystal display panel is injecting liquid crystal molecules between a Thin-Film Transistor (TFT) array substrate and a color filter (CF) substrate, and applying a driving voltage on the two substrates to control rotation directions of the liquid crystal molecules in order to refract lights from a backlight module to generate a picture.

In an active liquid crystal display device, each pixel is electrically connected with one TFT. A gate of the TFT is connected with a horizontal scanning line, a drain of the TFT is connected with a vertical data line, and a source of the TFT is connected with a pixel electrode. When a sufficient voltage is applied on the horizontal scanning line, all of the TFTs connected with the same horizontal scanning line will be turned on such that signal voltages on the data lines can be written into the pixels, and controlling light transmittance of different liquid crystal molecules in order to control colors and brightnesses. The driving of the horizontal scanning lines of an active liquid crystal display panel is mainly achieved by an external integrated circuit (IC). The external IC can control the horizontal scanning lines to charge and discharge stage by stage.

A gate driver on array (GOA) technology is a row driving technology of an array substrate, which can utilize an original array manufacturing process of the liquid crystal display panel to fabricate the driving circuit of the horizontal scanning lines on a peripheral portion of a display region of a substrate so as to replace the external IC to finish the driving of the horizontal scanning lines. The GOA technology can reduce a bonding process of the external IC in order to increase production capacity and decrease the production cost. Besides, the GOA technology can make a liquid crystal display panel to be more suitable for a narrow-frame or a no-frame display product.

Generally, the GOA circuit includes following types: a GOA circuit based on P-type thin film transistors, a GOA circuit based on CMOS, and a GOA circuit based on N-type thin-film transistors. Wherein, the GOA circuit based on P-type thin film transistors, especially, the GOA circuit based on P-type thin film transistor made of a LTPS material has features of simple and low current leakage so that the development future is well. However, the conventional GOA scanning circuit having a bi-directional function requires more thin-film transistors and signal lines such that a non-effective display area is occupied more, which is not beneficial for a narrow-frame design or a no-frame design.

SUMMARY OF THE INVENTION

The main technology problem solved by the present invention is to provide a liquid crystal display device and a GOA scanning circuit, which can realize a bi-directional scanning function, and the required thin-film transistors and signal lines are fewer at the same time.

In order to solve the above technology problem, a technology solution adopted by the present invention is: a Gate Driver on Array (GOA) scanning circuit, wherein the GOA scanning circuit includes multiple cascaded GOA circuit units, and an n-th stage (N≥n≥1, and n is an positive integer) GOA circuit unit comprises: a forward and backward scanning module including a first thin-film transistor and a second thin-film transistor T2, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor T2 is connected with a stage-transferring signal of a next stage GOA circuit unit; wherein, a control terminal of a first thin-film of a first stage GOA circuit unit is connected with a forward scanning trigger signal, and a control terminal of a second thin-film transistor of a Nth stage GOA circuit unit is connected with a backward scanning trigger signal; and an output module connected with the first node, and used for outputting a stage-transferring signal and a scanning signal of the present stage GOA circuit unit according to a voltage level of the first node; the output module includes a third transistor, a fourth transistor and a first capacitor; a control terminal of the third transistor and a control terminal of the fourth transistor are both connected with the first node; a first current path terminal of the third transistor is connected with the second clock signal; A second current path terminal of the third transistor is used for outputting the stage-transferring signal of the present stage GOA circuit unit; a first current path terminal of the fourth transistor T4 is connected with the second clock signal CK, and the second current path terminal of the fourth transistor is used for outputting the scanning signal of the present stage GOA circuit unit; two terminals of the first capacitor are respectively connected with the first node and the second current path terminal of the third transistor; the first clock signal and the second clock signal are opposite in phase.

Wherein, the n-th stage GOA circuit unit further includes a pull-down holding module; the pull-down holding module includes a fifth thin-film transistor, a sixth thin-film transistor and a seventh thin-film transistor; a control terminal of the fifth thin-film transistor, a control terminal of the sixth thin-film transistor and a control terminal of the seventh thin-film transistor are all connected with a second node; two current path terminals of the fifth thin-film transistor are respectively connected with the second current path terminal of the third thin-film transistor and a first constant voltage; two current path terminals of the sixth thin-film transistor are respectively connected with the second current path terminal of the fourth thin-film transistor and the first constant voltage; two current path terminals of the seventh thin-film transistor are respectively connected with the first node and a second constant voltage.

Wherein, the n-th stage GOA circuit unit further includes a pull-down module; the pull-down module includes an eighth thin-film transistor and a ninth thin-film transistor; a second current path terminal of the eighth thin-film transistor is connected with the second constant voltage; a control terminal of the eighth thin-film transistor is connected with the first node; two current path terminals of the ninth thin-film transistor are respectively connected with the second node and the second constant voltage; a control terminal of the ninth thin-film transistor is connected with the first node; the n-th GOA circuit unit further includes a tenth thin-film transistor, an eleventh thin-film transistor, a twelfth thin-film transistor2 and a second capacitor; a first current path terminal of the tenth thin-film transistor is connected with the second clock signal, and a second current path terminal of the tenth thin-film transistor0 is connected with a first current path terminal of the eleventh thin-film transistor; a second current path terminal of the eleventh thin-film transistor is connected with the second node, and a control terminal of the eleventh thin-film transistor is connected with the second clock signal; a control terminal of the tenth thin-film transistor is connected with a second current path terminal of the twelfth thin-film transistor; a first current path terminal and a control terminal of the twelfth thin-film transistor are both connected with the first clock signal, and a second current path terminal of the twelfth thin-film transistor is connected with a first terminal of the second capacitor and a first current path terminal of the eighth thin-film transistor; a second terminal of the second capacitor is connected with the second constant voltage.

In order to solve the above technology problem, another technology solution adopted by the present invention is: a Gate Driver on Array (GOA) scanning circuit, wherein the GOA scanning circuit includes multiple cascaded GOA circuit units, and an n-th stage (N≥n≥1, and n is an positive integer) GOA circuit unit comprises: a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor is connected with a stage-transferring signal of a next stage GOA circuit unit; wherein, a control terminal of a first thin-film of a first stage GOA circuit unit is connected with a forward scanning trigger signal, and a control terminal of a second thin-film transistor of a Nth stage GOA circuit unit is connected with a backward scanning trigger signal; and an output module connected with the first node, and used for outputting a stage-transferring signal and a scanning signal of the present stage GOA circuit unit according to a voltage level of the first node.

Wherein, the output module includes a third transistor, a fourth transistor and a first capacitor; a control terminal of the third transistor and a control terminal of the fourth transistor are both connected with the first node; a first current path terminal of the third transistor is connected with the second clock signal; A second current path terminal of the third transistor is used for outputting the stage-transferring signal of the present stage GOA circuit unit; a first current path terminal of the fourth transistor is connected with the second clock signal, and the second current path terminal of the fourth transistor is used for outputting the scanning signal of the present stage GOA circuit unit; two terminals of the first capacitor are respectively connected with the first node and the second current path terminal of the third transistor.

Wherein, the n-th stage GOA circuit unit further includes a pull-down holding module; the pull-down holding module includes a fifth thin-film transistor, a sixth thin-film transistor and a seventh thin-film transistor; a control terminal of the fifth thin-film transistor, a control terminal of the sixth thin-film transistor and a control terminal of the seventh thin-film transistor are all connected with a second node; two current path terminals of the fifth thin-film transistor are respectively connected with the second current path terminal of the third thin-film transistor and a first constant voltage; two current path terminals of the sixth thin-film transistor are respectively connected with the second current path terminal of the fourth thin-film transistor and the first constant voltage; two current path terminals of the seventh thin-film transistor are respectively connected with the first node and a second constant voltage.

Wherein, the n-th stage GOA circuit unit further includes a pull-down module; the pull-down module includes an eighth thin-film transistor and a ninth thin-film transistor; a second current path terminal of the eighth thin-film transistor is connected with the second constant voltage; a control terminal of the eighth thin-film transistor is connected with the first node; two current path terminals of the ninth thin-film transistor are respectively connected with the second node and the second constant voltage; a control terminal of the ninth thin-film transistor is connected with the first node; the n-th GOA circuit unit further includes a tenth thin-film transistor, an eleventh thin-film transistor, a twelfth thin-film transistor and a second capacitor; a first current path terminal of the tenth thin-film transistor is connected with the second clock signal, and a second current path terminal of the tenth thin-film transistor is connected with a first current path terminal of the eleventh thin-film transistor; a second current path terminal of the eleventh thin-film transistor is connected with the second node, and a control terminal of the eleventh thin-film transistor is connected with the second clock signal; a control terminal of the tenth thin-film transistor is connected with a second current path terminal of the twelfth thin-film transistor; a first current path terminal and a control terminal of the twelfth thin-film transistor are both connected with the first clock signal, and a second current path terminal of the twelfth thin-film transistor is connected with a first terminal of the second capacitor and a first current path terminal of the eighth thin-film transistor; a second terminal of the second capacitor is connected with the second constant voltage.

Wherein, the first constant voltage VGH1 and the second constant voltage are equal.

Wherein, the first constant voltage is greater than the second constant voltage.

Wherein, the first to the twelfth thin-film transistors are all P-type thin-film transistors.

Wherein, the control terminals of the first to the twelfth thin-film transistors are all gates.

Wherein, a drain of the first thin-film transistor is connected with the first clock signal, and a source of the first thin-film transistor is connected with the first node; a drain of the second thin-film transistor is connected with the second clock signal, and a source of the second thin-film transistor is connected with the first node; the first current path terminal of the third thin-film transistor is a drain, and the second current path terminal of the third thin-film transistor is a source; the first current path terminal of the fourth thin-film transistor is a drain, and the second current path terminal of the fourth thin-film transistor is a source; a drain of the fifth thin-film transistor is connected with the second current path terminal of the third thin-film transistor; a source of the fifth thin-film transistor is connected with the first constant voltage; a drain of the sixth thin-film transistor is connected with the second current path terminal of the fourth thin-film transistor; the source of the sixth thin-film transistor is connected with the first constant voltage; a drain of the seventh thin-film transistor is connected with the first node, and a source of the seventh thin-film transistor is connected with the second constant voltage; a first current path terminal of the eighth thin-film transistor is a drain, and a second current path terminal of the eighth thin-film transistor is a source; a drain of the ninth thin-film transistor is connected with the second node, and a source of the ninth thin-film transistor is connected with the second constant voltage; the first current path terminal of the tenth thin-film transistor is a drain, and the second current path terminal of the tenth thin-film transistor is a source; the first current path terminal of the eleventh thin-film transistor is a drain, and the second current path terminal of the eleventh thin-film transistor is a source; the first current path terminal of the twelfth thin-film transistor is a drain, and the second current path terminal of the twelfth thin-film transistor is a source.

In order solve the above technology problem, another technology solution solved by the present invention is: a liquid crystal display device, wherein, the liquid crystal display device includes a Gate Driver on Array (GOA) scanning circuit, the GOA scanning circuit includes multiple cascaded GOA circuit units, and an n-th stage (N≥n≥1, and n is an positive integer) GOA circuit unit includes: a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor is connected with a stage-transferring signal of a next stage GOA circuit unit; wherein, a control terminal of a first thin-film of a first stage GOA circuit unit is connected with a forward scanning trigger signal, and a control terminal of a second thin-film transistor of a Nth stage GOA circuit unit is connected with a backward scanning trigger signal; and an output module connected with the first node, and used for outputting a stage-transferring signal and a scanning signal of the present stage GOA circuit unit according to a voltage level of the first node.

Wherein, the output module includes a third transistor, a fourth transistor and a first capacitor; a control terminal of the third transistor and a control terminal of the fourth transistor are both connected with the first node; a first current path terminal of the third transistor is connected with the second clock signal; A second current path terminal of the third transistor is used for outputting the stage-transferring signal of the present stage GOA circuit unit; a first current path terminal of the fourth transistor is connected with the second clock signal, and the second current path terminal of the fourth transistor is used for outputting the scanning signal of the present stage GOA circuit unit; two terminals of the first capacitor are respectively connected with the first node and the second current path terminal of the third transistor.

Wherein, the n-th stage GOA circuit unit further includes a pull-down holding module; the pull-down holding module includes a fifth thin-film transistor, a sixth thin-film transistor and a seventh thin-film transistor; a control terminal of the fifth thin-film transistor, a control terminal of the sixth thin-film transistor and a control terminal of the seventh thin-film transistor are all connected with a second node; two current path terminals of the fifth thin-film transistor are respectively connected with the second current path terminal of the third thin-film transistor and a first constant voltage; two current path terminals of the sixth thin-film transistor are respectively connected with the second current path terminal of the fourth thin-film transistor and the first constant voltage; two current path terminals of the seventh thin-film transistor are respectively connected with the first node and a second constant voltage.

Wherein, the n-th stage GOA circuit unit further includes a pull-down module; the pull-down module includes an eighth thin-film transistor and a ninth thin-film transistor; a second current path terminal of the eighth thin-film transistor is connected with the second constant voltage; a control terminal of the eighth thin-film transistor is connected with the first node; two current path terminals of the ninth thin-film transistor are respectively connected with the second node and the second constant voltage; a control terminal of the ninth thin-film transistor is connected with the first node; the n-th GOA circuit unit further includes a tenth thin-film transistor0, an eleventh thin-film transistor, a twelfth thin-film transistor and a second capacitor; a first current path terminal of the tenth thin-film transistor is connected with the second clock signal, and a second current path terminal of the tenth thin-film transistor is connected with a first current path terminal of the eleventh thin-film transistor; a second current path terminal of the eleventh thin-film transistor is connected with the second node, and a control terminal of the eleventh thin-film transistor is connected with the second clock signal; a control terminal of the tenth thin-film transistor is connected with a second current path terminal of the twelfth thin-film transistor; a first current path terminal and a control terminal of the twelfth thin-film transistor2 are both connected with the first clock signal, and a second current path terminal of the twelfth thin-film transistor is connected with a first terminal of the second capacitor and a first current path terminal of the eighth thin-film transistor; a second terminal of the second capacitor is connected with the second constant voltage.

Wherein, the first constant voltage and the second constant voltage are equal.

Wherein, the first constant voltage is greater than the second constant voltage.

Wherein, the first to the twelfth thin-film transistors are all P-type thin-film transistors.

Wherein, the control terminals of the first to the twelfth thin-film transistors are all gates.

Comparing with the conventional art, in the present invention, through disposing a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor is connected with a stage-transferring signal of a next stage GOA circuit unit so that the number of the signal lines and the thin-film transistors required by a GOA scanning circuit can be reduced, which is beneficial for a narrow-frame design.

DETAILED DESCRIPTION OF THE PREFERRED EMBODIMENT

The following content will combine figures and embodiments for a detail description of the present invention.

Figure 1:
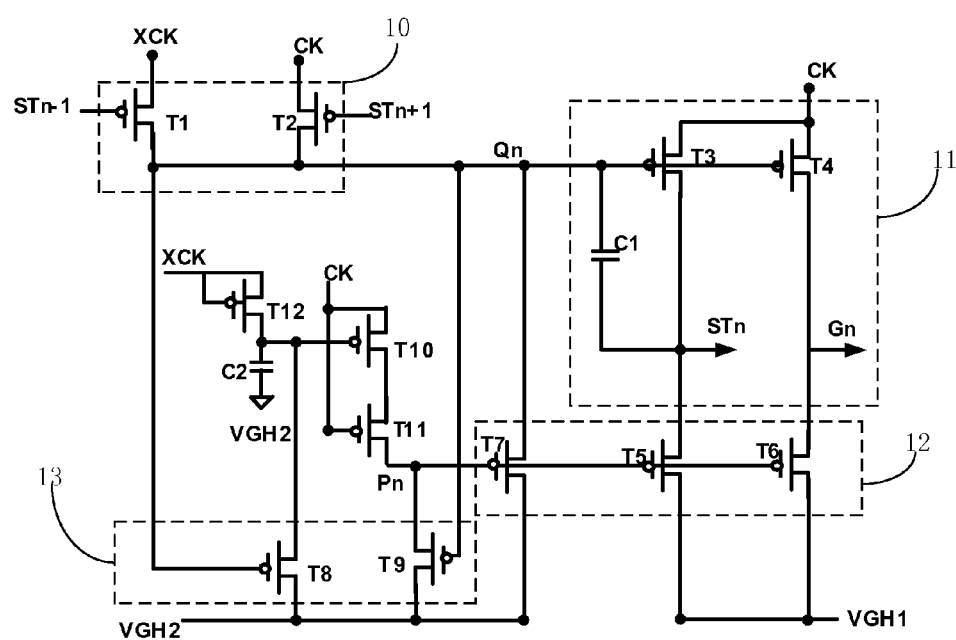
FIG. 1 is a schematic circuit diagram of an n-th stage scanning circuit unit of a GOA scanning circuit according to an embodiment of the present invention.

With reference to FIG. 1, FIG. 1 is a schematic circuit diagram of an n-th stage scanning circuit unit of a GOA scanning circuit according to an embodiment of the present invention. In the present embodiment, the GOA scanning circuit includes multiple cascaded GOA circuit units. An n-th stage (N≥n≥1, and n is a positive integer) GOA circuit unit includes: a forward and backward scanning module 10 and an output module 11. The forward and backward scanning module 10 includes a first thin-film transistor T1, a second thin-film transistor T2. Two current path terminals are respectively connected with a first clock signal XCK and a first node Qn. Two current path terminals of the second thin-film transistor T2 are respectively connected with a second clock signal CK and a first node Qn. A control terminal of the first thin-film transistor T1 is connected with a stage-transferring signal STn−1 of a previous stage GOA circuit unit. A control terminal of the second thin-film transistor T2 is connected with a stage-transferring signal STn+1 of a next stage GOA circuit unit. Wherein, a control terminal of a first thin-film T1 of a first stage GOA circuit unit is connected with a forward scanning trigger signal STV1, and a control terminal of a second thin-film transistor T2 of a Nth stage GOA circuit unit is connected with a backward scanning trigger signal STV2. The output module connected with the first node Qn, and used for outputting a stage-transferring signal STn and a scanning signal Gn of the present stage GOA circuit unit according to a voltage level of the first node Qn. When a forward scanning process is performed, in a sequence from the first stage to the Nth stage GOA circuit unit, providing scanning signals G1~GN to corresponding pixel units. When a backward scanning process is performed, in a sequence from the Nth stage to the first stage GOA circuit unit, providing scanning signals GN~G1 to corresponding pixel units.

Preferably, the output module 11 includes a third transistor T3, a fourth transistor T4 and a first capacitor C1. A control terminal of the third transistor T3 and a control terminal of the fourth transistor T4 are both connected with the first node Qn. A first current path terminal of the third transistor T3 is connected with the second clock signal CK. A second current path terminal of the third transistor T3 is used for outputting the stage-transferring signal STn of the present stage GOA circuit unit. A first current path terminal of the fourth transistor T4 is connected with the second clock signal CK, and the second current path terminal of the fourth transistor T4 is used for outputting the scanning signal Gn of the present stage GOA circuit unit. Two terminals of the first capacitor C1 are respectively connected with the first node Qn and the second current path terminal of the third transistor T3.

Preferably, the n-th stage GOA circuit unit further includes a pull-down holding module 12. The pull-down holding module 12 includes a fifth thin-film transistor T5, a sixth thin-film transistor T6 and a seventh thin-film transistor T7. A control terminal of the fifth thin-film transistor T5, a control terminal of the sixth thin-film transistor T6 and a control terminal of the seventh thin-film transistor T7 are all connected with a second node Pn. Two current path terminals of the fifth thin-film transistor T5 are respectively connected with the second current path terminal of the third thin-film transistor T3 and a first constant voltage VGH1. Two current path terminals of the sixth thin-film transistor T6 are respectively connected with the second current path terminal of the fourth thin-film transistor T4 and the first constant voltage VGH1. Two current path terminals of the seventh thin-film transistor T7 are respectively connected with the first node Qn and a second constant voltage VGH2.

Preferably, the n-th stage GOA circuit unit further includes a pull-down module 13. The pull-down module 13 includes an eighth thin-film transistor T8 and a ninth thin-film transistor T9. A second current path terminal of the eighth thin-film transistor T8 is connected with the second constant voltage VGH2. A control terminal of the eighth thin-film transistor T8 is connected with the first node Qn. Two current path terminals of the ninth thin-film transistor T9 are respectively connected with the second node Pn and the second constant voltage VGH2. A control terminal of the ninth thin-film transistor T9 is connected with the first node Qn.

The n-th stage GOA circuit unit further includes a tenth thin-film transistor T10, an eleventh thin-film transistor T11, a twelfth thin-film transistor T12 and a second capacitor C2. A first current path terminal of the tenth thin-film transistor T10 is connected with the second clock signal CK, and a second current path terminal of the tenth thin-film transistor T10 is connected with a first current path terminal of the eleventh thin-film transistor T11. A second current path terminal of the eleventh thin-film transistor T11 is connected with the second node Pn, and a control terminal of the eleventh thin-film transistor T11 is connected with the second clock signal CK. A control terminal of the tenth thin-film transistor T10 is connected with a second current path terminal of the twelfth thin-film transistor T12. A first current path terminal and a control terminal of the twelfth thin-film transistor T12 are both connected with the first clock signal XCK, and a second current path terminal of the twelfth thin-film transistor T12 is connected with a first terminal of the second capacitor C2 and a first current path terminal of the eighth thin-film transistor T8. A second terminal of the second capacitor C2 is connected with the second constant voltage VGH2.

Preferably, the first constant voltage VGH1 and the second constant voltage VGH2 are equal. The first constant voltage VGH1 and the second constant voltage VGH2 can be connected with a same signal line VGH. In another embodiment, the first constant voltage VGH1 can be greater than the second constant voltage VGH2 in order to hold a voltage difference Vgs between a gate and a source of the first thin-film transistor T1 in a non-outputting period to be greater than zero in order reduce a current leakage.

Preferably, the first to the twelfth thin-film transistors are all P-type thin-film transistors.

Preferably, the control terminals of the first to the twelfth thin-film transistors are all gates.

Preferably, a drain of the first thin-film transistor T1 is connected with the first clock signal XCK, and a source of the first thin-film transistor T1 is connected with the first node Qn. A drain of the second thin-film transistor T2 is connected with the second clock signal CK, and a source of the second thin-film transistor T2 is connected with the first node Qn. The first current path terminal of the third thin-film transistor T3 is a drain, and the second current path terminal of the third thin-film transistor T3 is a source. The first current path terminal of the fourth thin-film transistor T4 is a drain, and the second current path terminal of the fourth thin-film transistor T4 is a source. A drain of the fifth thin-film transistor T5 is connected with the second current path terminal of the third thin-film transistor T3. A source of the fifth thin-film transistor T5 is connected with the first constant voltage VGH1. A drain of the sixth thin-film transistor T6 is connected with the second current path terminal of the fourth thin-film transistor T4. The source of the sixth thin-film transistor T6 is connected with the first constant voltage VGH1; a drain of the seventh thin-film transistor T7 is connected with the first node Qn, and a source of the seventh thin-film transistor T7 is connected with the second constant voltage VGH2. A first current path terminal of the eighth thin-film transistor T8 is a drain, and a second current path terminal of the eighth thin-film transistor T8 is a source. A drain of the ninth thin-film transistor T9 is connected with the second node Pn, and a source of the ninth thin-film transistor T9 is connected with the second constant voltage VHG2. The first current path terminal of the tenth thin-film transistor T10 is a drain, and the second current path terminal of the tenth thin-film transistor T10 is a source. The first current path terminal of the eleventh thin-film transistor T11 is a drain, and the second current path terminal of the eleventh thin-film transistor T11 is a source. The first current path terminal of the twelfth thin-film transistor T12 is a drain, and the second current path terminal of the twelfth thin-film transistor T12 is a source.

Preferably, the first clock signal XCK and the second clock signal CK are opposite in phase.

The following will combine the embodiment for illustrating the operation principle of the GOA scanning circuit of the present invention. Besides, using the first stage GOA circuit unit and the second stage GOA circuit in a forward scanning process as an example.

First period: when performing a forward scanning process, a forward scanning trigger signal STV1 turns on the first thin-film transistor T1. At this time, the first clock signal XCK connected with the drain of the first thin-film transistor T1 of the first stage GOA circuit unit is a low voltage level. The first thin-film transistor T1 is turned on, and the second thin-film transistor T2 is turned off. The first clock signal XCK pulls down the first node Q1 to a low voltage level. The third thin-film transistor T3 and the fourth thin-film transistor T4 are turned on. The stage-transferring signal ST1 of the first stage GOA circuit unit and the scanning signal G1 of the first stage GOA circuit unit both output high voltage levels. The eighth thin-film transistor T8 and the ninth thin-film transistor T9 are turned on, and a voltage level of the second node P1 is pulled up. The seventh thin-film transistor T7, the fifth thin-film transistor T5 and the sixth thin-film transistor T6 are turned off. The first node Q1 is held at a low voltage level.

Second period: because the ST1 and the G1 in the first period output high voltage levels, through the capacitor C1, the node Q1 is coupled to a lower voltage level. The third thin-film transistor T3 and the fourth thin-film transistor T4 have larger open-state currents. The second clock signal CK in the second period is in a low voltage level so that the scanning signal G1 output a low voltage level in order to drive a corresponding pixel unit (the outputted low voltage level of the scanning signal G1 can turn on a thin-film transistor in the pixel unit such that a data line can charge a liquid crystal capacitor in the pixel unit). The second clock signal CK in the second period is a low voltage level so that the ST1 output a low voltage level. At the same time, the ST1 turns on the first thin-film transistor T1 of the second stage GOA unit. The first clock signal XCK charges a first node Q2 of the second stage GOA circuit unit through the first thin film transistor T1 of the second GOA circuit unit. When the first clock signal XCK is changed in phase in a next period, the node Q2 of the second stage GOA circuit unit is pulled down in order to drive the second stage GOA circuit unit, the operation principle is identical with above process.

Third period: a signal ST2 turns on the second thin-film transistor T2 of the first stage GOA circuit unit. Because the second clock signal CK is a high voltage level in the third period, a voltage level of the first node Q1 is pulled up. The third thin-film transistor T3 and the fourth thin-film transistor T4 are turned off. The fifth thin-film transistor T5, the sixth thin-film transistor T6 and the seventh thin-film transistor T7 are turned on.

Fourth period: the second clock signal CK charges the second node P1 through the tenth thin-film transistor T10 and the eleventh thin-film transistor T11. The second node P1 is held in a low voltage level at a remaining time of one frame. The fifth thin-film transistor T5, the sixth thin-film transistor T6 and the seventh thin-film transistor T7 are turned on to hold the Q1 node and the G1 node in high voltage levels (the outputted high voltage level of the scanning signal G1 can turn off a thin-film transistor in the pixel unit such that a liquid crystal capacitor can hold a voltage level of the pixel unit), a voltage level of the pixel unit can be held.

Similarly, the signal ST2 drive the second stage GOA circuit unit, and is similar with the above process. The signal STn drives the (n+1)th GOA circuit unit, and is similar with the above process, and transferring to an N-th GOA circuit unit stage by stage.

Similarly, when performing a backward scanning process, a signal STV2 turns on a transistor T2 of an Nth stage GOA circuit unit. At this time, a second clock signal CK connected with a drain of the transistor T2 is a low voltage level, QN is a low voltage level in order to turn on a third thin-film transistor T3 and a fourth thin-film transistor T4. The specific process is similar with the above process, no more repeating. A signal STN drive a (N−1)th stage GOA circuit unit, a signal STN−1 drive a (N−2)th stage GOA circuit unit until transferring to a first GOA circuit unit.

Figure 2:
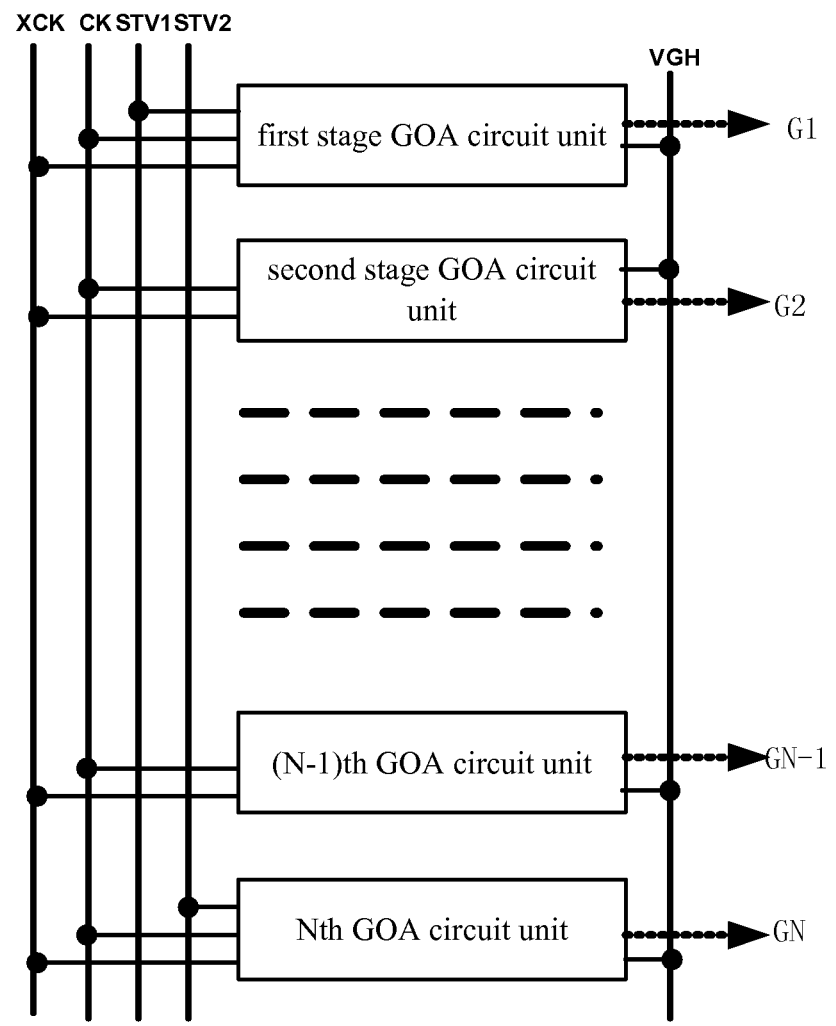
FIG. 2 is a schematic structure of a GOA scanning circuit according to an embodiment of the present invention.

With reference to FIG. 2, and FIG. 2 is a schematic structure diagram of a GOA scanning circuit according to an embodiment of the present invention. In the present embodiment, a first constant voltage VGH1 and a second constant voltage VGH2 are equal, and are provided by a same signal line VGH. Because a forward and backward scanning module includes a first thin-film transistor T1 and a second thin-film transistor T2. Two current path terminals of the first thin-film transistor T1 are respectively connected with a first clock signal XCK and a first node Qn. Two current path terminals of the second thin-film transistor T2 are respectively connected with a second clock signal CK and the first node Qn. A control terminal of the first thin-film transistor T1 is connected with a stage-transferring signal STn−1 of a previously GOA circuit unit, and a control terminal of the second thin-film transistor T2 is connected with a stage-transferring signal STn+1 of a next GOA circuit unit. Accordingly, only through a group of clock signals (the first clock signal XCR and the second clock signals CK) and a forward trigger signal STV1 and a backward trigger signal STV2, the forward and backward scanning function can be achieved.

Comparing with the conventional GOA scanning circuit having a forward and backward scanning function, the conventional GOA scanning circuit requires two groups of clock signals. Accordingly, the present invention can reduce the signal lines. Besides, through the above way to achieve a GOA scanning circuit, the number of the thin-film transistors is decreased. As shown in FIG. 2, the required signal lines for the GOA scanning circuit are a forward scanning trigger signal STV1, a backward scanning trigger signal STV2, a first clock signal XCK and a second clock signal CK. Accordingly, the signal lines required by the present invention are decreased.

Figure 3:
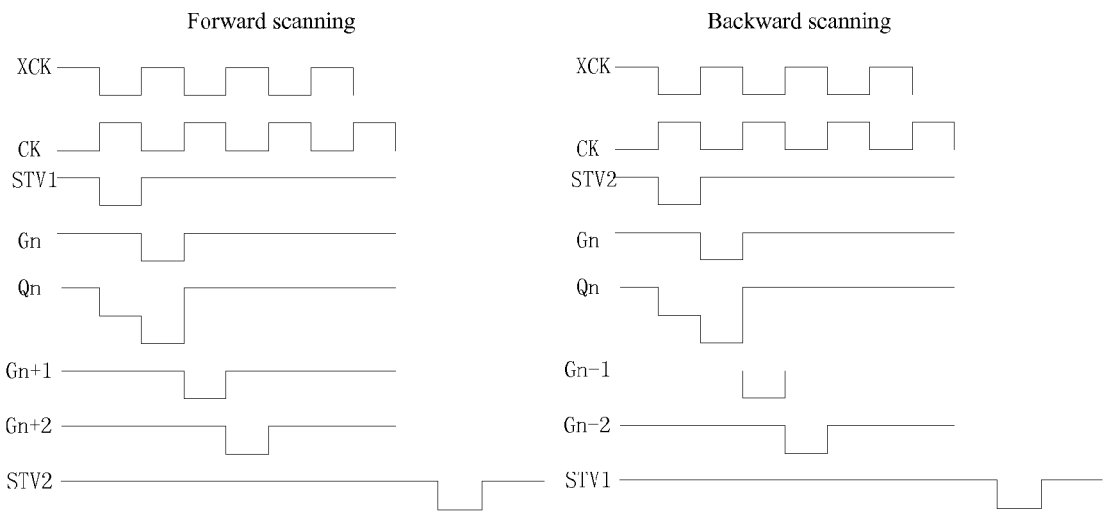
FIG. 3 is a timing diagram of signal lines of the GOA scanning circuit under operation.

With further reference to FIG. 3, and FIG. 3 is a timing diagram of signal lines of a GOA scanning circuit under operating. As shown in FIG. 3, the first clock signal XCK and the second clock signal CK are opposite in phase. That is, at any time, voltage levels of the both are opposite. When the forward scanning trigger signal STV1 is a low voltage level, a forward scanning process is triggered. When the backward scanning trigger signal STV2 is a low voltage level, a backward scanning process is triggered. Combining the operation principle described in the above GOA scanning circuit, and still using the first stage GOA circuit unit and the second stage GOA circuit in a forward scanning process as an example for illustrating.

As shown in FIG. 3, when a forward scanning process is performed, as described above, in a first period, the forward scanning trigger signal STV1 is a low voltage level, the first clock signal XCK is a low voltage level, the second clock signal CK is a voltage level, the first node Q1 is a low voltage level, the signal G1 is a high voltage level, and the signal G2 is a high voltage level. In a second period, the first clock signal XCK is a high voltage level, the second clock signal CK is a low voltage level, the first node Q1 has a lower voltage level than in the first period, the signal G1 is a low voltage level, the signal G2 is a high voltage level. In a third period, the first clock signal XCK is a low voltage level, the second clock signal CK is a high voltage level, the first node Q1 is a high voltage level, the signal G1 is a high voltage level, the signal G2 is a low voltage level. In a fourth period, the first clock signal XCK is a high voltage level, the second clock signal CK is a low voltage level, and the first node Q1 and the signal G1 are both high voltage levels.

Wherein, in the second period, as described above, the signal ST1 turns on the first thin-film transistor T1 of the second stage GOA circuit unit. The first clock signal XCK charge the first node Q2 of the second stage GOA circuit unit through the first thin-film transistor T1 of the second stage GOA circuit unit. When the first clock signal XCK is changed in phase in a next period (that is, a third period), the node Q2 of the second stage GOA circuit unit is pulled down in order to drive the second stage GOA circuit unit. The operation principle is identical as described above. As shown in FIG. 3, sequentially from the first stage to the Nth GOA circuit units, each time when the clock signal is changed in phase, a signal Gn outputted from a GOA circuit is a low voltage level. Similarly, when a backward scanning is performed, a signal STV2 firstly turns on a second thin-film transistor T2 of an Nth stage GOA circuit unit. At this time, a second clock signal CK connected with a drain of the second thin-film transistor T2 is a low voltage level, and a node QN is a low voltage level in order to turn on the third thin-film transistor T3 and the fourth thin-film transistor T4. The specific process is similar as described above, no more repeating. A signal STN drives a (N−1)th stage GOA circuit unit, a signal STN−1 drives a (N−2)th stage GOA unit until transferring to the first stage GOA circuit unit. Each time when the clock signal is changed in phase, a signal Gn outputted from a GOA circuit is a low voltage level.

Figure 4:
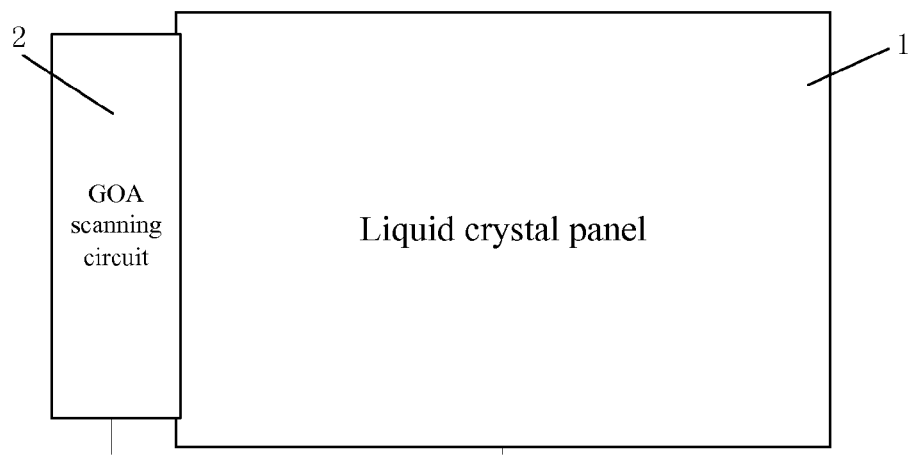
FIG. 4 is a schematic diagram of a liquid crystal display device of the present invention.

With reference to FIG. 4, FIG. 4 is a schematic diagram of a liquid crystal display device of the present invention. In the present embodiment, the liquid crystal display device includes a liquid crystal panel 1 and a GOA scanning circuit 2 located at a side of the liquid crystal panel 1. Wherein, the GOA scanning circuit 2 is a GOA scanning circuit described in anyone of the above embodiments.

Comparing with the conventional art, in the present invention, through disposing a forward and backward scanning module including a first thin-film transistor T1 and a second thin-film transistor T2, wherein, two current path terminals of the first thin-film transistor T1 are respectively connected with a first clock signal XCK and a first node Qn; two current path terminals of the second thin-film transistor T2 are respectively connected with a second clock signal CK and the first node Qn; a control terminal of the first thin-film transistor T1 is connected with a stage-transferring signal STn−1 of a previous stage GOA circuit unit; a control terminal of the second thin-film transistor T2 is connected with a stage-transferring signal STn+1 of a next stage GOA circuit unit so that the number of the signal lines and the thin-film transistors required by a GOA scanning circuit can be reduced, which is beneficial for a narrow-frame design.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A Gate Driver on Array (GOA) scanning circuit, wherein the GOA scanning circuit includes multiple cascaded GOA circuit units, and an n-th stage (N≥n≥1, and n is a positive integer, N is a positive integer and greater than or equal to 2) GOA circuit unit comprises:

a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor is connected with a stage-transferring signal of a next stage GOA circuit unit; wherein, a control terminal of a first thin-film of a first stage GOA circuit unit is connected with a forward scanning trigger signal, and a control terminal of a second thin-film transistor of a Nth stage GOA circuit unit is connected with a backward scanning trigger signal; and an output module connected with the first node, and used for outputting a stage-transferring signal and a scanning signal of a present stage GOA circuit unit according to a voltage level of the first node; the output module includes a third transistor, a fourth transistor and a first capacitor; a control terminal of the third transistor and a control terminal of the fourth transistor are both connected with the first node; a first current path terminal of the third transistor is connected with the second clock signal; a second current path terminal of the third transistor is used for outputting the stage-transferring signal of the present stage GOA circuit unit; a first current path terminal of the fourth transistor is connected with the second clock signal, and the second current path terminal of the fourth transistor is used for outputting the scanning signal of the present stage GOA circuit unit; two terminals of the first capacitor are respectively connected with the first node and the second current path terminal of the third transistor; the first clock signal and the second clock signal are opposite in phase.

2. The GOA scanning circuit according to claim 1, wherein, the n-th stage GOA circuit unit further includes a pull-down holding module; the pull-down holding module includes a fifth thin-film transistor, a sixth thin-film transistor and a seventh thin-film transistor; a control terminal of the fifth thin-film transistor, a control terminal of the sixth thin-film transistor and a control terminal of the seventh thin-film transistor are all connected with a second node; two current path terminals of the fifth thin-film transistor are respectively connected with the second current path terminal of the third thin-film transistor and a first constant voltage; two current path terminals of the sixth thin-film transistor are respectively connected with the second current path terminal of the fourth thin-film transistor and the first constant voltage; two current path terminals of the seventh thin-film transistor are respectively connected with the first node and a second constant voltage.

3. The GOA scanning circuit according to claim 2, wherein, the n-th stage GOA circuit unit further includes a pull-down module; the pull-down module includes an eighth thin-film transistor and a ninth thin-film transistor; a second current path terminal of the eighth thin-film transistor is connected with the second constant voltage; a control terminal of the eighth thin-film transistor is connected with the first node; two current path terminals of the ninth thin-film transistor are respectively connected with the second node and the second constant voltage; a control terminal of the ninth thin-film transistor is connected with the first node; the n-th GOA circuit unit further includes a tenth thin-film transistor, an eleventh thin-film transistor, a twelfth thin-film transistor and a second capacitor; a first current path terminal of the tenth thin-film transistor is connected with the second clock signal, and a second current path terminal of the tenth thin-film transistor is connected with a first current path terminal of the eleventh thin-film transistor; a second current path terminal of the eleventh thin-film transistor is connected with the second node, and a control terminal of the eleventh thin-film transistor is connected with the second clock signal; a control terminal of the tenth thin-film transistor is connected with a second current path terminal of the twelfth thin-film transistor; a first current path terminal and a control terminal of the twelfth thin-film transistor are both connected with the first clock signal, and a second current path terminal of the twelfth thin-film transistor is connected with a first terminal of the second capacitor and a first current path terminal of the eighth thin-film transistor; a second terminal of the second capacitor is connected with the second constant voltage.

4. A Gate Driver on Array (GOA) scanning circuit, wherein the GOA scanning circuit includes multiple cascaded GOA circuit units, and an n-th stage (N≥n≥1, and n is an positive integer, N is a positive integer and greater than or equal to 2) GOA circuit unit comprises:
a forward and backward scanning module including a first thin-film transistor and a second thin-film transistor, wherein, two current path terminals of the first thin-film transistor are respectively connected with a first clock signal and a first node; two current path terminals of the second thin-film transistor are respectively connected with a second clock signal and the first node; a control terminal of the first thin-film transistor is connected with a stage-transferring signal of a previous stage GOA circuit unit; a control terminal of the second thin-film transistor is connected with a stage-transferring signal of a next stage GOA circuit unit; wherein, a control terminal of a first thin-film of a first stage GOA circuit unit is connected with a forward scanning trigger signal, and a control terminal of a second thin-film transistor of a Nth stage GOA circuit unit is connected with a backward scanning trigger signal; and an output module connected with the first node, and used for outputting a stage-transferring signal and a scanning signal Gn of a present stage GOA circuit unit according to a voltage level of the first node.

5. The GOA scanning circuit according to claim 4, wherein, the output module includes a third transistor, a fourth transistor and a first capacitor; a control terminal of the third transistor and a control terminal of the fourth transistor are both connected with the first node; a first current path terminal of the third transistor is connected with the second clock signal; a second current path terminal of the third transistor is used for outputting the stage-transferring signal of the present stage GOA circuit unit; a first current path terminal of the fourth transistor is connected with the second clock signal, and the second current path terminal of the fourth transistor is used for outputting the scanning signal of the present stage GOA circuit unit; two terminals of the first capacitor are respectively connected with the first node and the second current path terminal of the third transistor.

6. The GOA scanning circuit according to claim 5, wherein, the n-th stage GOA circuit unit further includes a pull-down holding module; the pull-down holding module includes a fifth thin-film transistor, a sixth thin-film transistor and a seventh thin-film transistor; a control terminal of the fifth thin-film transistor, a control terminal of the sixth thin-film transistor and a control terminal of the seventh thin-film transistor are all connected with a second node; two current path terminals of the fifth thin-film transistor are respectively connected with the second current path terminal of the third thin-film transistor and a first constant voltage; two current path terminals of the sixth thin-film transistor are respectively connected with the second current path terminal of the fourth thin-film transistor and the first constant voltage; two current path terminals of the seventh thin-film transistor are respectively connected with the first node and a second constant voltage.

7. The GOA scanning circuit according to claim 6, wherein, the n-th stage GOA circuit unit further includes a pull-down module; the pull-down module includes an eighth thin-film transistor and a ninth thin-film transistor; a second current path terminal of the eighth thin-film transistor is connected with the second constant voltage; a control terminal of the eighth thin-film transistor is connected with the first node; two current path terminals of the ninth thin-film transistor are respectively connected with the second node and the second constant voltage; a control terminal of the ninth thin-film transistor is connected with the first node; the n-th GOA circuit unit further includes a tenth thin-film transistor, an eleventh thin-film transistor, a twelfth thin-film transistor and a second capacitor; a first current path terminal of the tenth thin-film transistor is connected with the second clock signal, and a second current path terminal of the tenth thin-film transistor is connected with a first current path terminal of the eleventh thin-film transistor; a second current path terminal of the eleventh thin-film transistor is connected with the second node, and a control terminal of the eleventh thin-film transistor is connected with the second clock signal; a control terminal of the tenth thin-film transistor is connected with a second current path terminal of the twelfth thin-film transistor; a first current path terminal and a control terminal of the twelfth thin-film transistor are both connected with the first clock signal, and a second current path terminal of the twelfth thin-film transistor is connected with a first terminal of the second capacitor and a first current path terminal of the eighth thin-film transistor; a second terminal of the second capacitor is connected with the second constant voltage.

8. The GOA scanning circuit according to claim 7, wherein, the first constant voltage and the second constant voltage are equal.

9. The GOA scanning circuit according to claim 7, wherein, the first constant voltage is greater than the second constant voltage.

10. The GOA scanning circuit according to claim 7, wherein, the first to the twelfth thin-film transistors are all P-type thin-film transistors.

11. The GOA scanning circuit according to claim 7, wherein, the control terminals of the first to the twelfth thin-film transistors are all gates.

12. The GOA scanning circuit according to claim 11, wherein, a drain of the first thin-film transistor is connected with the first clock signal, and a source of the first thin-film transistor is connected with the first node; a drain of the second thin-film transistor is connected with the second clock signal, and a source of the second thin-film transistor is connected with the first node; the first current path terminal of the third thin-film transistor is a drain, and the second current path terminal of the third thin-film transistor is a source; the first current path terminal of the fourth thin-film transistor is a drain, and the second current path terminal of the fourth thin-film transistor is a source; a drain of the fifth thin-film transistor is connected with the second current path terminal of the third thin-film transistor; a source of the fifth thin-film transistor is connected with the first constant voltage; a drain of the sixth thin-film transistor is connected with the second current path terminal of the fourth thin-film transistor; the source of the sixth thin-film transistor is connected with the first constant voltage; a drain of the seventh thin-film transistor is connected with the first node, and a source of the seventh thin-film transistor is connected with the second constant voltage; a first current path terminal of the eighth thin-film transistor is a drain, and a second current path terminal of the eighth thin-film transistor is a source; a drain of the ninth thin-film transistor is connected with the second node, and a source of the ninth thin-film transistor is connected with the second constant voltage; the first current path terminal of the tenth thin-film transistor is a drain, and the second current path terminal of the tenth thin-film transistor is a source; the first current path terminal of the eleventh thin-film transistor is a drain, and the second current path terminal of the eleventh thin-film transistor is a source; the first current path terminal of the twelfth thin-film transistor is a drain, and the second current path terminal of the twelfth thin-film transistor is a source.

* * * * *